United States Patent
Jing et al.

(10) Patent No.: US 10,497,897 B2
(45) Date of Patent: Dec. 3, 2019

(54) PATCH PACKAGING DEVICE AND METHOD

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yangkun Jing, Beijing (CN); Qing Liu, Beijing (CN); Liangshi Li, Beijing (CN); Jiakai Yang, Beijing (CN); Guanghe Ma, Beijing (CN)

(73) Assignees: BOE TECHNOLOGY GROP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/511,742

(22) PCT Filed: Apr. 29, 2016

(86) PCT No.: PCT/CN2016/080632
§ 371 (c)(1),
(2) Date: Mar. 16, 2017

(87) PCT Pub. No.: WO2016/177295
PCT Pub. Date: Nov. 10, 2016

(65) Prior Publication Data
US 2018/0047937 A1 Feb. 15, 2018

(30) Foreign Application Priority Data
May 5, 2015 (CN) .......................... 2015 1 0224958

(51) Int. Cl.
*H01L 51/52* (2006.01)
*H01L 51/56* (2006.01)
(Continued)

(52) U.S. Cl.
CPC ...... *H01L 51/5246* (2013.01); *H01L 27/3244* (2013.01); *H01L 51/524* (2013.01);
(Continued)

(58) Field of Classification Search
CPC ............. H01L 51/5426; H01L 27/3244; H01L 51/524; H01L 51/56; H01L 2227/323;
(Continued)

(56) References Cited

U.S. PATENT DOCUMENTS

2003/0011737 A1 1/2003 Matsuoka
2003/0173033 A1* 9/2003 Lee ..................... B32B 38/1841
156/382
(Continued)

FOREIGN PATENT DOCUMENTS

CN 1395134 A 2/2003
CN 101069453 A 11/2007
(Continued)

OTHER PUBLICATIONS

International Search Report and Written Opinion for Application No. PCT/CN2016/080632, dated Aug. 8, 2016, 14 Pages.
(Continued)

*Primary Examiner* — George R Koch
(74) *Attorney, Agent, or Firm* — Brooks Kushman P.C.

(57) ABSTRACT

A patch packaging method and device are provided. The method includes sucking, by a suction mechanism, a loaded cover plate; carrying, by the suction mechanism, the cover plate to move in a direction toward a cavity of a patch packaging mechanism, wherein a substrate to be attached with a patch is placed within the cavity; placing, by the
(Continued)

suction mechanism, the cover plate into the cavity, wherein the cover plate, the substrate and side walls of the cavity form an enclosed chamber; extracting, by an air-extraction mechanism, air from the enclosed chamber via an air-outlet hole arranged in the side walls; supplying, by a gas-supply mechanism, a light gas having a density lower than that of the air into the enclosed chamber via a gas-inlet hole arranged in the side walls; and pressing, by a pressing mechanism, the enclosed chamber in such a manner that the cover plate is completely pressed onto the substrate after the light gas is extracted.

16 Claims, 3 Drawing Sheets

(51) Int. Cl.
  *B32B 37/10* (2006.01)
  *H01L 27/32* (2006.01)
  *G02F 1/1333* (2006.01)
  *G02F 1/13* (2006.01)
(52) U.S. Cl.
  CPC .......... *H01L 51/56* (2013.01); *B32B 37/1018* (2013.01); *G02F 1/1303* (2013.01); *G02F 2001/133322* (2013.01); *G02F 2001/133354* (2013.01); *H01L 2227/323* (2013.01)
(58) Field of Classification Search
  CPC ................. B32B 37/1018; B32B 41/00; G02F 2001/133354
  USPC ......................................................... 156/378
  See application file for complete search history.

(56) References Cited

U.S. PATENT DOCUMENTS

| | | | |
|---|---|---|---|
| 2009/0186215 A1* | 7/2009 | Sato | B23K 20/02 428/336 |
| 2013/0000816 A1* | 1/2013 | Van Den Brand | B32B 37/0046 156/64 |
| 2014/0311668 A1 | 10/2014 | Yanagi | |
| 2016/0226020 A1 | 8/2016 | Jing et al. | |

FOREIGN PATENT DOCUMENTS

| | | |
|---|---|---|
| CN | 103872264 A | 6/2014 |
| CN | 103947292 A | 7/2014 |
| CN | 104538564 A | 4/2015 |
| CN | 104821377 A | 8/2015 |
| JP | 2010250008 A | 11/2010 |

OTHER PUBLICATIONS

First Office Action for Chinese Application No. 201510224958.3, dated Jul. 12, 2016, 9 Pages.

Second Office Action for Chinese Application No. 201510224958.3, dated Dec. 23, 2016, 8 Pages.

* cited by examiner

PATCH PACKAGING DEVICE AND METHOD

CROSS-REFERENCE TO RELATED APPLICATION APPLICATIONS

This application is the U.S. national phase of PCT Application No. PCT/CN2016/080632 filed on Apr. 29, 2016, which claims priority to Chinese Patent Application No. 201510224958.3 filed on May 5, 2015, the disclosures of which are incorporated in their entirety by reference herein.

TECHNICAL FIELD

The present disclosure relates to a field of display techniques, and in particular, to a patch packaging device and a patch packaging method.

BACKGROUND

With the development of display techniques, requirements for a patch packaging device for an Active Matrix Organic Light-Emitting Diode (AMOLED) by manufacture processes of display devices having curved-surfaces such as curved-surface televisions and curved-surface mobile phones are higher and higher. It is necessary for the patch packaging device to both ensure a curvature of a curved surface and control a suction force to a substrate appropriately. Hence, it is urgent to design a new type of patch packaging device for emerging AMOLED displays or other curved-surface display devices.

Current patch packaging devices for three-dimensional curved-surface AMOLEDs have drawn flexible and variable concepts from a multi-point AMOLED patch packaging technique. Specifically, suction to a rigid substrate used in an AMOLED patch packaging device for a curved-surface glass substrate is discretized into suction to several short substrates (using a plurality of Suction Bars), and pressing and shaping the three-dimensional curved-surface glass substrate is implemented by using these Suction Bars. Such AMOLED patch packaging device may patch and package a three-dimensional curved-surface glass substrate efficiently and continuously. As compared with packaging an AMOLED patch by a platform of a pressing machine, it is unnecessary to design, manufacture and debug the platform of the pressing machine, thus saving substantial manpower, materials, and time. However, bubbles may be generated during pressing, causing a low yield rate of produced patches.

SUMMARY

A main object of the present disclosure is to provide a technical solution which may prevent bubbles from being generated when pressing patches, thereby improving a yield rate of a patch product.

In order to achieve the above object, in one aspect, the present disclosure provides a patch packaging device. The patch packaging device includes a suction mechanism configured to suck a cover plate having been loaded; a patch packaging mechanism provided with a cavity for accommodating the cover plate having been loaded and a substrate that has been loaded and needs to be attached with a patch, wherein the cover plate, the substrate and side walls of the cavity form an enclosed chamber after the cover plate is placed by the suction mechanism into the cavity, and a gas-inlet hole and an air-outlet hole are arranged in the side walls; an air-extraction mechanism configured to extract air from the enclosed chamber via the air-outlet hole; a gas-supply mechanism configured to supply a light gas having a density lower than that of the air into the enclosed chamber via the gas-inlet hole; and a pressing mechanism configured to press the enclosed chamber in such a manner that the cover plate is completely pressed onto the substrate after the light gas is extracted.

Optionally, the patch packaging device further includes: a first loading mechanism configured to load the cover plate to a predetermined position, wherein the predetermined position is directly above the cavity; and a second loading mechanism configured to load the substrate and place the substrate into the cavity.

Optionally, the patch packaging device further includes an image capture mechanism configured to acquire image position information about at least two first identification points preset on the cover plate after the cover plate is sucked by the suction mechanism, and acquire image position information about at least two second identification points preset on the substrate after the substrate is placed by the second loading mechanism into the cavity; a determination module configured to determine whether each of the first identification points is aligned with a corresponding one of the second identification points or not, by judging whether the image position information about the at least two first identification points coincides with the image position information about the at least two second identification points or not; and an alignment mechanism configured to adjust a position of the suction mechanism or a position of the cavity in case that one of the first identification points is not aligned with the corresponding one of the second identification points, so that the one of the first identification points is completely aligned with the corresponding one of the second identification points.

Optionally, the image capture mechanism includes one or two cameras; if one camera is used, the camera is arranged above the suction mechanism or below the patch packaging mechanism; and if two cameras are used, the two cameras are arranged above the suction mechanism and below the patch packaging mechanism, respectively.

Optionally, both the number of the first identification points and the number of the second identification points are four; the four first identification points are arranged at four corners of the cover plate, respectively; and the four second identification points are arranged at four corners of the substrate, respectively.

Optionally, the suction mechanism includes a suction body and a plurality of vacuum suction components; wherein a plurality of air-extraction slots are arranged in the suction body, the plurality of air-extraction slots are in communication with via-holes in the plurality of vacuum suction components and are configured to cooperate with the plurality of vacuum suction components to suck the cover plate; and each of the plurality of vacuum suction components is provided with an elastic suction member for forming a tight contact with the cover plate.

Optionally, the pressing mechanism and the suction mechanism are formed integrally; the pressing mechanism is provided with a pressing frame that is recessed inwardly to form a recessed portion; the recessed portion is configured to be capable of aligning with and contacting the cavity in a sealed manner when being pressed.

Optionally, the gas-supply mechanism and the air-extraction mechanism are formed integrally, and the air-outlet hole and the gas-inlet hole are the same hole.

Optionally, the light gas includes hydrogen or helium.

In another aspect, the present disclosure provides a patch packaging method. The patch packaging method includes: sucking, by a suction mechanism, a cover plate having been loaded; causing the suction mechanism carrying the cover plate to move in a direction toward a cavity of a patch packaging mechanism, wherein a substrate to be attached with a patch is placed into the cavity; placing, by the suction mechanism, the cover plate into the cavity so that the cover plate, the substrate and side walls of the cavity form an enclosed chamber; extracting, by an air-extraction mechanism, air from the enclosed chamber via an air-outlet hole arranged in the side walls; supplying, by a gas-supply mechanism, a light gas having a density lower than that of the air into the enclosed chamber via a gas-outlet hole arranged in the side walls; and pressing, by a pressing mechanism, the enclosed chamber, in such a manner that the cover plate is completely pressed onto the substrate after the light gas is extracted.

The patch packaging device and the patch packaging method of the present disclosure do not need an additional step for removing bubbles generated when packaging an AMOLED patch even if the bubbles are generated, since a gas contained in the bubbles is a light gas and may rise automatically when the packaged AMOLED patches are exposed to the atmosphere, thereby removing the bubbles. Thus, energy may be saved and a yield rate of the packaged AMOLED patches may be increased substantially.

DETAILED DESCRIPTION

Embodiments of the present disclosure will be described hereinafter clearly and completely in conjunction with drawings of the present disclosure. Obviously, the described embodiments are only a part of, but not all of, the embodiments of the present disclosure. Based on the embodiments in the present disclosure, all other embodiments obtained by one of ordinary skills in the art without creative labor fall into the protection scope of the present disclosure.

Although the patch packaging device currently used widely for curved-surface AMOLEDs have advantages, as compared with the AMOLED patch packaging device using a platform of a pressing machine, of needlessness of designing, manufacturing, and debugging the platform, and advantages of saving substantial manpower, materials, and time costs, bubbles may possibly be generated when using such a patch packaging device in a patch packaging procedure, causing a low yield rate of produced patches.

Figure 1:
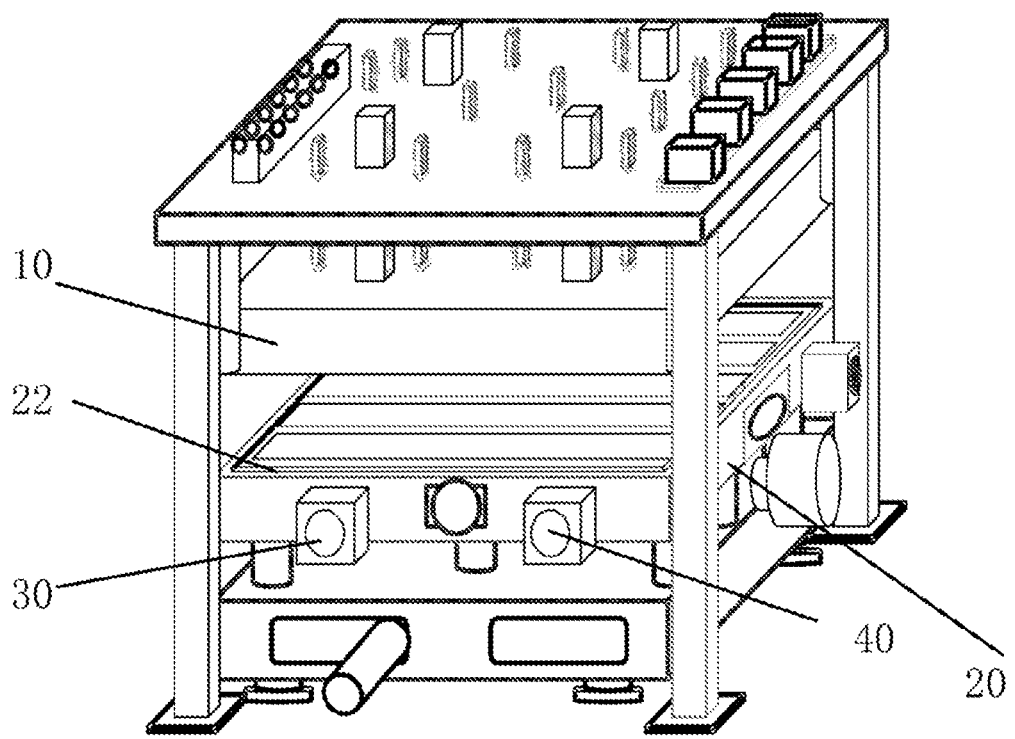
FIG. 1 is a schematic diagram of a patch packaging device according to embodiments of the present disclosure.
Figure 3:
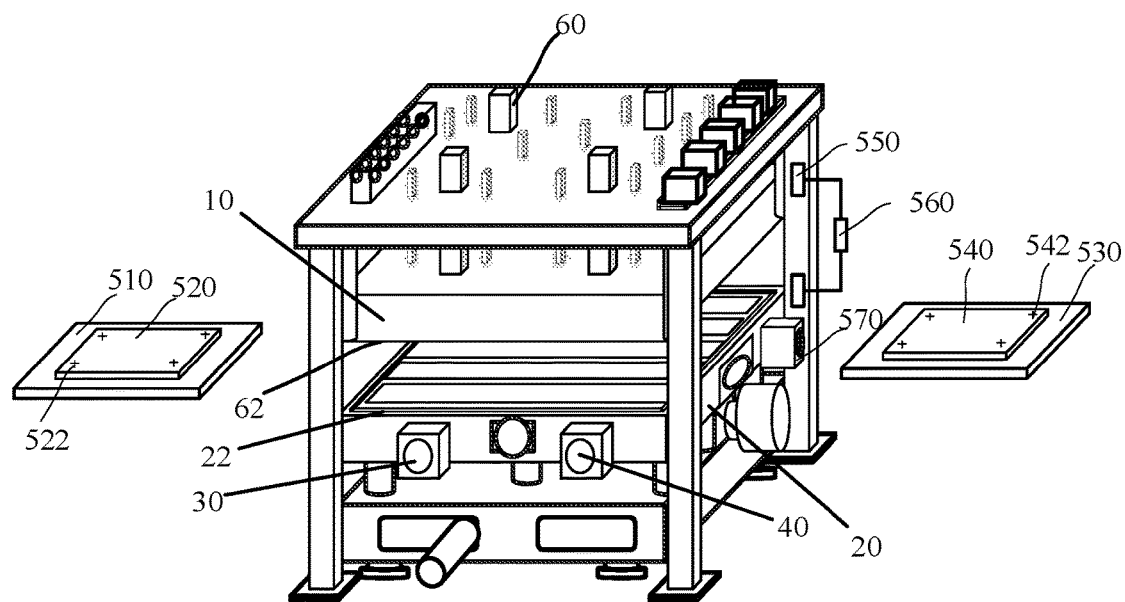
FIG. 3 is a structural schematic view of a specific example of a patch packaging device according to embodiments of the present disclosure.

In order to overcome the above-mentioned technical defect, the present disclosure provides a patch packaging device. FIG. 1 is a schematic diagram of a patch packaging device according to embodiments of the present disclosure. As shown in FIG. 1, the patch packaging device generally includes a suction mechanism 10, a patch packaging mechanism 20, an air-extraction mechanism 30, a gas-supply mechanism 40 and a pressing mechanism 60 (as shown in FIG. 3).

The suction mechanism 10 is configured to suck a cover plate having been loaded. The patch packaging mechanism 20 is provided with a cavity 22 for accommodating the cover plate and a substrate that have been loaded and need to be attached with a patch. The cover plate, the substrate and side walls of the cavity 22 form an enclosed chamber after the cover plate is placed by the suction mechanism into the cavity 22. A gas-inlet hole and an air-outlet hole are arranged in the side walls.

The air-extraction mechanism 30 is configured to extract air from the enclosed chamber via the air-outlet hole (not shown). The gas-supply mechanism 40 is configured to supply a light gas having a density lower than that of the air to the enclosed chamber via the gas-inlet hole (not shown).

The pressing mechanism is configured to press the enclosed chamber, so that the cover plate is completely pressed onto the substrate after the light gas is extracted.

Of course, positional and structural relations of the above mechanisms shown in FIG. 1 may be adjusted flexibly, and connection fashions thereof shown in FIG. 1 are merely optional. In actual applications, the cover plate and the substrate (patch) may be packaged as long as above-mentioned functional structures are provided.

Air in the enclosed chamber defined by the cover plate, the substrate and the side walls of the cavity 22 may be extracted firstly by the above patch packaging device, before attaching the cover plate onto the substrate. However, because it is difficult to achieve a complete vacuum environment, it is impossible to completely extract the air from the enclosed chamber, i.e., there is still much or less air in the enclosed chamber. Thus, in order to completely extract the air, a light gas having a density lower than that of the air may be supplied into the enclosed chamber. In this way, even if some bubbles are formed temporarily in the patch packaging procedure, the bubbles definitely disappear gradually since the light gas contained in the bubbles has a density lower than that of the air.

It should be noted that, because indications of all mechanisms or members in the schematic diagram of the device shown in FIG. 1 are difficult or even impede understanding them, structures or members described hereinafter are not indicated in FIG. 1, and positions and arrangements of the structures or members are not limited as long as they may implement functions thereof.

In the embodiments of the present disclosure, as shown in FIG. 3, the patch packaging device may further include a first loading mechanism 510 and a second loading mechanism 530. The first loading mechanism 510 is configured to load the cover plate 520 to a predetermined position, wherein the predetermined position is directly above the cavity 22; and the second loading mechanism 530 is configured to load the substrate 540 and place the substrate into the cavity 22.

In the embodiments of the present disclosure, the patch packaging device may further include an image capture mechanism 550, a determination module 560 and an alignment mechanism 570.

The image capture mechanism 550 is configured to acquire image position information about at least two first identification points 522 (i.e., marks for identification and alignment) preset on the cover plate after the cover plate has been sucked by the suction mechanism, and acquire image position information about at least two second identification points 542 (i.e., marks for identification and alignment)

preset on the substrate after the substrate has been placed by the second loading mechanism into the cavity 22.

For example, in actual applications, in order to reduce complexity of the device, the image capture mechanism is not required to have a complex structure, and a camera having a relative high resolution qualifies.

The determination module is configured to determine whether a position of each of the first identification points is aligned with a position a corresponding one of the second identification points or not, by judging whether the image position information about the first identification points coincides with the image position information about the corresponding second identification point or not.

Of course, in actual applications, the determination module may be implemented through a combination of software and hardware.

The alignment mechanism is configured to, in case that the position of the first identification point is not aligned with the position of the corresponding second identification point, adjust a position of the suction mechanism or the cavity 22, so that the position of the first identification point is completely aligned with the position of the corresponding second identification point.

It may be seen from the above that relative positions between the cover plate and the substrate may be identified and adjusted by means of the image capture mechanism, the determination module and the alignment mechanism. Of course, if the position of the cover plate loaded by the first loading mechanism of the patch packaging device and the position of the substrate loaded by the second loading mechanism of the patch packaging device have sufficient accuracies, the mechanisms and modules for identifying and adjusting the positions may not be provided. However, if these mechanisms and modules are provided, the accuracies of the positions may generally be increased and thereby an accuracy of the subsequent patch packaging procedure may be further increased.

In an optional embodiment of the present disclosure, the above image capture mechanism may include one or two cameras. The image capture mechanism may be arranged in the following ways in accordance with the number of the cameras: (1) if one camera is used, the camera is arranged above the suction mechanism or below the patch packaging mechanism; (2) if two cameras are used, the two cameras are arranged above the suction mechanism and below the patch packaging mechanism, respectively.

Obviously, the above way "(1)" may be adopted if it desires to reduce the complexity and the cost of the device; and the above way "(2)" may be adopted if it desires to increase the accuracy of the patch packaging procedure.

In the embodiments of the present disclosure, both the number of the first identification points and the number of the second identification points are four. The four first identification points are arranged at four corners of the cover plate respectively, and the four second identification points are arranged at four corners of the substrate respectively.

Generally, when manufacturing a Printed Circuit Board (PCB) or a patch, arranging one mark at each of the four corners of the PCB or the patch is better if costs are not taken into consideration. This arrangement greatly facilitates alignment and adjustment of positions in the patch packaging procedure.

Figure 4:
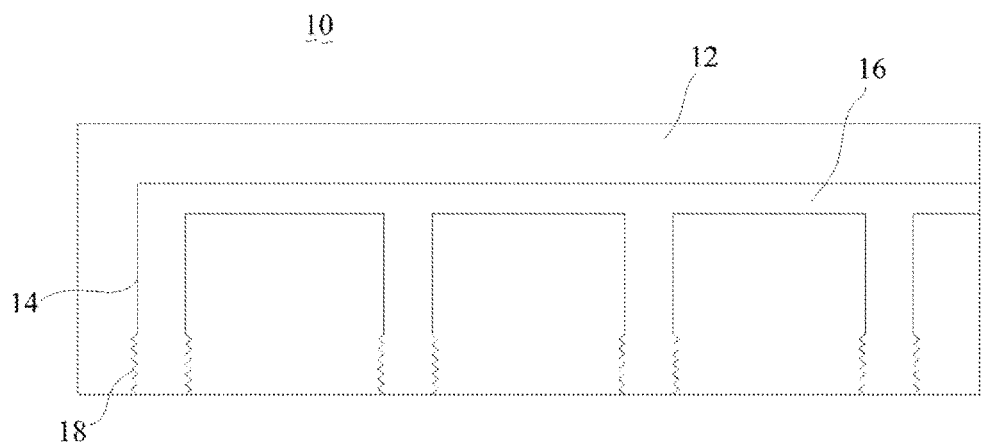
FIG. 4 is a structural schematic view of a suction mechanism of a patch packaging device according to embodiments of the present disclosure.

In the embodiments of the present disclosure, as shown in FIG. 4, the suction mechanism 10 may include a suction body 12 and a plurality of vacuum suction components 14. The suction body is provided with a plurality of air-extraction slots 16. The plurality of air-extraction slots 16 are in communication with via-holes in the plurality of vacuum suction components and are configured to cooperate with the plurality of vacuum suction components to suck the cover plate. Each vacuum suction component is provided with an elastic suction member 18 which is used to closely contact with the cover plate.

Of course, in actual applications, an arrangement fashion and the number of the air-extraction slots and the number of the vacuum suction components may be determined according to requirements of manufacture processes as long as the air may be extracted from the air-extraction slots and thereby the plurality of vacuum suction components may suck the cover plate through the elastic suction members, so as to move the cover plate.

In the embodiments of the present disclosure, the pressing mechanism and the suction mechanism are formed integrally. The pressing mechanism is provided with a pressing frame 62. The pressing frame 62 is recessed inwardly to form a recessed portion. When being pressing, the recessed portion is capable of aligning with and contacting the cavity 22 in a sealed manner. In this way, an environment of the enclosed chamber for patching may be facilitated to be formed.

In an optional embodiment of the present disclosure, the gas-supply mechanism and the air-extraction mechanism may be formed integrally, and the air-outlet hole and the gas-inlet hole may be the same hole.

Of course, the above arrangement of the gas-supply mechanism and the air-extraction mechanism is made for a purpose of reducing complexity and size of the device. The gas-supply mechanism and the air-extraction mechanism may also be arranged separately without considering the purpose. For example, the air-extraction mechanism and the air-outlet hole may be arranged on one side of the cavity 22, and the gas-supply mechanism and the gas-inlet hole may be arranged on the other side of the cavity 22. In this way, after the air within the enclosed chamber has been completely extracted by the air-extraction mechanism via the air-outlet hole, the light gas may be supplied by the gas-supply mechanism into the enclosed chamber via the air-inlet hole.

In the embodiments of the present disclosure, the light gas may include hydrogen or helium. Of course, in actual applications, any other light gas having a stable property may also be used.

Figure 2:
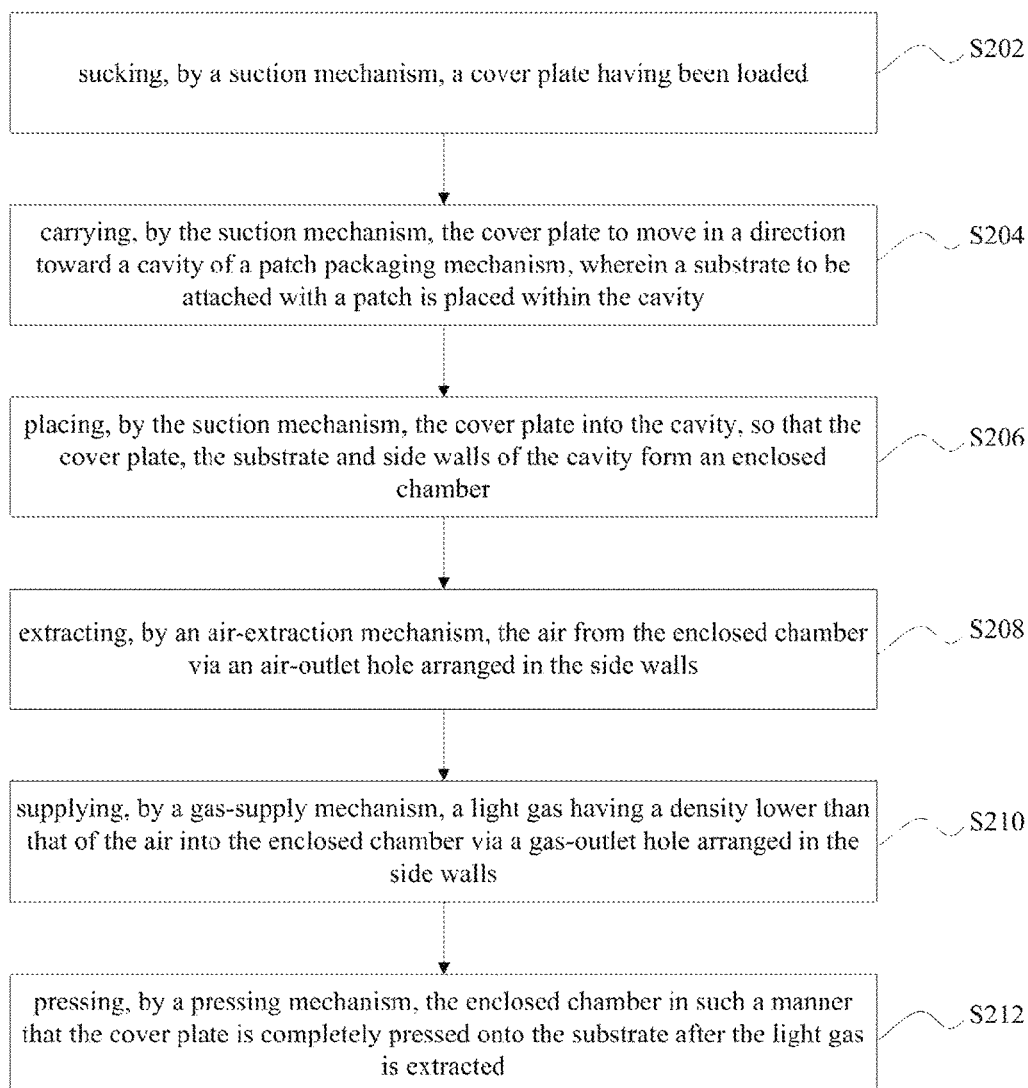
FIG. 2 is a flow chart of a patch packaging method according to embodiments of the present disclosure.

Corresponding to the above-mentioned patch packaging device, the present disclosure further provides a patch packaging method. FIG. 2 is a flow chart of a patch packaging method according to embodiments of the present disclosure. As shown in FIG. 2, the patch packing method includes the following Step S202 to Step S212.

Step S202: sucking, by a suction mechanism, a cover plate having been loaded.

Step S204: carrying, by the suction mechanism, the cover plate to move in a direction toward a cavity of a patch packaging mechanism, wherein a substrate to be attached with a patch is placed within the cavity.

Step S206: placing, by the suction mechanism, the cover plate into the cavity, so that the cover plate, the substrate and side walls of the cavity form an enclosed chamber.

Step S208: extracting, by an air-extraction mechanism, the air from the enclosed chamber via an air-outlet hole arranged in the side walls.

Step S210: supplying, by a gas-supply mechanism, a light gas having a density lower than that of the air into the enclosed chamber via a gas-outlet hole arranged in the side walls.

Step S212: pressing, by a pressing mechanism, the enclosed chamber in such a manner that the cover plate is completely pressed onto the substrate after the light gas is extracted.

In combination with the above-mentioned patch packaging device, the patch packaging method may specifically include the following steps (1)-(10).

Step (1): An AMOLED patch A (i.e., the cover plate) is loaded by the first loading mechanism.

Step (2): The suction mechanism is moved to a position of the AMOLED patch A and then further moved downwardly. The air within the air-extraction slots of the suction mechanism may be extracted so that the AMOLED patch A is sucked. Then, the AMOLED patch A is lifted up to a level at which images may be captured, wherein the level may facilitate the upper image capture mechanism (i.e., the camera for acquiring the image position information about the four marks on the cover plate) to acquire the image position information about the four marks (i.e., the first identification points). Then, the first loading mechanism is returned to a position thereof prior to Step (1).

Step (3): The second loading mechanism loads an AMOLED patch B (i.e., the substrate) to be attached with a patch and places the AMOLED patch B into the cavity 22. The lower image capture mechanism for acquiring the image position information about the four marks (i.e., the second identification points) on the substrate is arranged above the cavity 22 and acquires the image position information about the four marks.

Step (4): The acquired position information about the four marks on the AMOLED patch A is compared with the acquired position information about the four marks on the AMOLED patch B.

Step (5): If a position deviation is determined to exist, the position of the AMOLED patch A or the AMOLED patch B is adjusted. Such adjustment to the positions includes adjusting horizontal displacement and/or an inclination angle of the suction mechanism in reference to the marks on the AMOLED patch B so as to adjust the position of the AMOLED patch A, or adjusting horizontal displacement and/or an inclination angle of the patch packaging mechanism 20 in reference to the marks on the AMOLED patch A so as to adjust the position of the AMOLED patch B. In one of the above two ways, an alignment between the AMOLED patch A and the AMOLED patch B is achieved.

Step (6): The suction mechanism carrying the AMOLED patch A is moved downwardly and vertically to a predetermined threshold level above a platform carrying the AMOLED patch B (a requirement that the positions of the cover plate, the substrate and the side walls of the cavity 22 may form the enclosed chamber is met when the AMOLED patch A is at this level). In this way, a pre-packaging procedure is finished. However, since no pressing operation is performed to the AMOLED patch A and the AMOLED patch B, the AMOLED patch A is not tightly attached onto the AMOLED patch B.

Step (7): The air-extraction mechanism vacuumizes the enclosed chamber via the air-outlet hole so as to extract the air therefrom.

Step (8): The gas-supply mechanism supplies the stable and light gas into the enclosed chamber via the gas-inlet hole. The stable and light gas may be hydrogen or helium that has a density lower than that of the air. The lower the density of the gas is, the better a resulting anti-bubble effect is.

Step (9): The pressing frame of the pressing mechanism formed integrally with the suction mechanism is moved further downwardly until a surface of the AMOLED patch A is in contact with a surface of the AMOLED patch B. At this time, the pressing frame is also in alignment with and in contact with the cavity 22 in a sealed manner. After the patches are packaged, the suction mechanism together with the pressing frame is separated from the AMOLED patch B, thereby completing the patch packaging procedure.

Step (10): The second loading mechanism moves the packaged AMOLED patch B away from a workplace, and then returns to a position thereof prior to Step (3), so as to facilitate bringing a new AMOLED patch B.

The patch packaging device and the patch packaging method provided in the embodiments of the present disclosure are advantageous in that: by supplying the stable and light gas before pressing the cover plate and the substrate and thereby forming an environment containing the stable and light gas therebetween so as to package the AMOLED patches within this environment, such method does not need an additional step for removing bubbles generated during the patch packaging procedure even if the bubbles are generated, since the gas contained in the bubbles is the light gas and may rise automatically when the packaged AMOLED patches are exposed to the atmosphere, thereby removing the bubbles. Thus, energy may be saved and a yield rate of the packaged AMOLED patches may be increased substantially.

The above embodiments are merely optional embodiments of the present disclosure. It should be noted that one of ordinary skills in the art may make modifications and improvements without departing from the spirit of the present disclosure, and these modifications and improvements also fall within the scope of the present disclosure.

What is claimed is:

1. A patch packaging device, comprising:
   a suction mechanism configured to suck a cover plate having been loaded;
   a patch packaging mechanism provided with a cavity for accommodating the cover plate having been loaded and a substrate that has been loaded and needs to be attached with a patch, wherein the cover plate, the substrate, and side walls of the cavity form an enclosed chamber after the cover plate is placed by the suction mechanism into the cavity, and a gas-inlet hole and an air-outlet hole are arranged in the side walls, wherein the enclosed chamber consists of the cover plate, the substrate, and the sidewalls of the cavity;
   an air-extraction mechanism configured to extract air from the enclosed chamber via the air-outlet hole;
   a gas-supply mechanism configured to supply a light gas having a density lower than that of the air into the enclosed chamber via the gas-inlet hole; and
   a pressing mechanism configured to press the enclosed chamber in such a manner that the cover plate is completely pressed onto the substrate after the light gas is extracted.

2. The patch packaging device according to claim 1, further comprising:
   a first loading mechanism configured to load the cover plate to a predetermined position, wherein the predetermined position is directly above the cavity; and
   a second loading mechanism configured to load the substrate and place the substrate into the cavity.

3. The patch packaging device according to claim 1, further comprising:
   an image capture mechanism configured to acquire image position information about at least two first identification points preset on the cover plate after the cover plate is sucked by the suction mechanism, and acquire image position information about at least two second identification points preset on the substrate after the substrate is placed by the second loading mechanism into the cavity;

a determination module configured to determine whether each of the first identification points is aligned with a corresponding one of the second identification points or not, by judging whether the image position information about the at least two first identification points coincides with the image position information about the at least two second identification points or not; and an alignment mechanism configured to adjust a position of the suction mechanism or a position of the cavity in case that one of the first identification points is not aligned with the corresponding one of the second identification points, so that the one of the first identification points is completely aligned with the corresponding one of the second identification points.

4. The patch packaging device according to claim 3, wherein the image capture mechanism comprises one or two cameras;

if one camera is used, the camera is arranged above the suction mechanism or below the patch packaging mechanism; and if two cameras are used, the two cameras are arranged above the suction mechanism and below the patch packaging mechanism, respectively.

5. The patch packaging device according to claim 3, wherein both the number of the first identification points and the number of the second identification points are four;

the four first identification points are arranged at four corners of the cover plate, respectively; and the four second identification points are arranged at four corners of the substrate, respectively.

6. The patch packaging device according to claim 1, wherein the suction mechanism comprises a suction body and a plurality of vacuum suction components;

wherein a plurality of air-extraction slots are arranged in the suction body, the plurality of air-extraction slots are in communication with via-holes in the plurality of vacuum suction components and are configured to cooperate with the plurality of vacuum suction components to suck the cover plate, and each of the plurality of vacuum suction components is provided with an elastic suction member for forming a tight contact with the cover plate.

7. The patch packaging device according to claim 1, wherein the pressing mechanism and the suction mechanism are formed integrally;

the pressing mechanism is provided with a pressing frame that is recessed inwardly to form a recessed portion; the recessed portion is configured to be capable of aligning with and contacting the cavity in a sealed manner when being pressed.

8. The patch packaging device according to claim 1, wherein the gas-supply mechanism and the air-extraction mechanism are formed integrally, and the air-outlet hole and the gas-inlet hole are the same hole.

9. The patch packaging device according to claim 1, wherein the light gas comprises hydrogen or helium.

10. The patch packaging device according to claim 1, wherein, the cover plate is a single planar plate, and the substrate is a single planar substrate.

11. The patch packaging device according to claim 1, wherein, both the cover plate and the substrate are Active Matrix Organic Light-Emitting Diode (AMOLED) patches.

12. The patch packaging device according to claim 1, wherein the cover plate and the substrate directly contact the side walls of the cavity to form the enclosed chamber.

13. The patch packaging device according to claim 1, wherein the enclosed chamber has a hexahedron shape.

14. The patch packaging device according to claim 13, wherein the side walls of the cavity are rigid side walls, the cover plate is an upper surface of the enclosed chamber, the substrate is a lower surface of the enclosed chamber, and the side walls of the cavity are remaining surfaces of the enclosed chamber.

15. A patch packaging method, comprising:

sucking, by a suction mechanism, a cover plate having been loaded;

carrying, by the suction mechanism, the cover plate to move in a direction toward a cavity of a patch packaging mechanism, wherein a substrate to be attached with a patch is placed into the cavity;

placing, by the suction mechanism, the cover plate within the cavity so that the cover plate, the substrate, and side walls of the cavity form an enclosed chamber, wherein the enclosed chamber consists of the cover plate, the substrate, and the sidewalls of the cavity;

extracting, by an air-extraction mechanism, air from the enclosed chamber via an air-outlet hole arranged in the side walls;

supplying, by a gas-supply mechanism, a light gas having a density lower than that of the air into the enclosed chamber via a gas-outlet hole arranged in the side walls; and pressing, by a pressing mechanism, the enclosed chamber in such a manner that the cover plate is completely pressed onto the substrate after the light gas is extracted.

16. The patch packaging method according to claim 15, wherein the light gas comprises hydrogen or helium.

* * * * *